US 6,557,675 B2

(54) TUNABLE VIBRATION DAMPER FOR PROCESSOR PACKAGES

(75) Inventor: Raymond J. Iannuzzelli, Amherst, NH (US)

(73) Assignee: Compaq Information Technologies Group, L.P., Houston, TX (US)

( * ) Notice: Subject to any disclaimer, the term of this patent is extended or adjusted under 35 U.S.C. 154(b) by 0 days.

(21) Appl. No.: 09/919,004

(22) Filed: Jul. 31, 2001

(65) Prior Publication Data

US 2003/0024781 A1 Feb. 6, 2003

(51) Int. Cl.⁷ .................................................. F16F 7/10
(52) U.S. Cl. ....................... 188/380; 267/136; 361/820
(58) Field of Search ................................. 188/378, 379, 188/380; 267/136, 137

(56) References Cited

U.S. PATENT DOCUMENTS

| | | | | |
|---|---|---|---|---|
| 5,010,949 A | * | 4/1991 | Dehaine | 165/185 |
| 5,648,893 A | * | 7/1997 | Loo et al. | 257/727 |
| 5,654,876 A | * | 8/1997 | Sathe et al. | 257/718 |
| 5,757,621 A | * | 5/1998 | Patel | 257/719 |
| 5,901,039 A | * | 5/1999 | Dehaine et al. | 257/719 |
| 5,915,508 A | * | 6/1999 | Lai | 188/379 |
| 5,966,289 A | * | 10/1999 | Hastings et al. | 165/185 |
| 6,039,035 A | * | 3/2000 | McPherson | 124/25.6 |
| 6,157,539 A | * | 12/2000 | Wagner et al. | 165/121 |
| 6,169,659 B1 | * | 1/2001 | Wheaton | 165/185 |
| 6,246,584 B1 | * | 6/2001 | Lee et al. | 24/458 |
| 6,304,450 B1 | * | 10/2001 | Dibene et al. | 165/185 |
| 6,307,748 B1 | * | 10/2001 | Lin et al. | 165/80.3 |
| 6,317,328 B1 | * | 11/2001 | Su | 165/80.3 |
| 6,320,268 B1 | * | 11/2001 | Lang et al. | 257/177 |
| 6,343,643 B1 | * | 2/2002 | Bollesen | 165/104.33 |

OTHER PUBLICATIONS

*A Primer on Suspension Testing*, found at http://brakelathes.com/pub/undercar/4187T.HTM, date unknown (8 p.).

* cited by examiner

Primary Examiner—Christopher P. Schwartz
Assistant Examiner—Devon Kramer
(74) Attorney, Agent, or Firm—Conley Rose, P.C.

(57) ABSTRACT

The present invention relates to a method and apparatus that minimizes shock/vibrational motion in interposer sockets. The ability to control shock/vibration can ensure successful operation and substantially increase socket lifetime. The present invention discloses a device for maintaining a heat sink in a desired relationship to a mounting base while limiting the transmission of shock and vibrational motion to and from the heat sink includes a fastener extending from the mounting base, a spring compressed between the fastener and the heat sink, and a damper compressed between the fastener and the sink wherein the fastener maintains the spring and the damper in a compressed state such that the spring and the damper bear on said heat sink.

37 Claims, 2 Drawing Sheets

TUNABLE VIBRATION DAMPER FOR PROCESSOR PACKAGES

CROSS-REFERENCE TO RELATED APPLICATIONS

The subject matter of the present application is related to the subject matter of co-pending application entitled "Dynamic. Isolating Mount for Processor Packages," incorporated herein by reference.

STATEMENT REGARDING FEDERALLY SPONSORED RESEARCH OR DEVELOPMENT

Not applicable.

BACKGROUND OF THE INVENTION

1. Field of the Invention

The present invention generally relates to the use of vibration isolation in mounting an electrical component on a circuit board. More particularly, the present invention relates to a tunable vibration damper for a microprocessor package.

2. Background of the Invention

For many decades, circuit boards, such as those used in computers, have been manufactured by attaching electrical components to the board. In some cases, the components are soldered directly to the board. Although generally satisfactory, soldering a component directly to the board makes it difficult and costly to change that component should it be desired or necessary to replace one component with another. A microprocessor, for example, may have hundreds of connections that, should the processor fail, must be desoldered. A new processor, with its hundred of connections must then be attached to the board. Further, this process must occur without damaging the other components mounted on the circuit board. Even if the processor has not failed, it still might be desired to replace it, for example, a new and improved version of the processor is made available.

For these and other reasons, "interposer" sockets have become available. Although defined in various ways, an interposer socket is a socket to which a chip (i.e., a microprocessor) is mated. The socket is then mated to the circuit board or to a socket soldered to the circuit board. Advantageously, an interposer docket does not require solder either to be mated to the board (or other socket) or to the electrical component mounted on it. Instead, a lever or other mechanism is engaged to hold the interposer socket to the circuit board.

As technology has progressed, some chips (i.e., microprocessors) have become more powerful and accordingly consume more electrical power. This increase in power usage causes the chips to become hotter and larger heat sinks are required to dissipate the increased thermal load. Mounting a large chip with a heat sink in an interposer socket may be problematic in the face of shock/vibration loads.

For example, motion caused by a fan, opening and closing cabinet doors in a rack of computers, seismic activity, and vibration induced by adjacent equipment may cause interposer sockets to fail and become intermittent. Obviously, this failure may cause the electrical component contained in the interposer to cease functioning as intended.

For successful operation and prevention of premature socket failure, the source of the vibration should be eliminated. If this is impossible or difficult, then a vibration isolation device should be used at or near the socket to minimize the potential for the socket to fail.

BRIEF SUMMARY OF THE INVENTION

The present invention relates to a method and apparatus that minimizes shock/vibrational motion in interposer sockets. The ability to control shock/vibration can ensure successful operation and substantially increase socket lifetime.

In accordance with a preferred embodiment of the present invention, a device for maintaining a heat sink in a desired relationship with a mounting base while limiting the transmission of shock and vibrational motion to and from the heat sink includes a fastener extending from the mounting base, a spring compressed between the fastener and the heat sink, and a damper compressed between the fastener and the heat sink wherein the fastener maintains the spring and the damper in a compressed state such that the spring and the damper bear on said heat sink.

In accordance with another preferred embodiment of the present invention, a method for limiting shock/vibrational motion of a microprocessor includes placing a damping material in parallel with a clamping spring, wherein the damping material is in the form of a sleeve that surrounds the clamping spring.

In accordance with yet another preferred embodiment of the present invention, a method for limiting shock/vibrational motion of a microprocessor comprising placing a damping material in series with a clamping spring, wherein the damping material is in the form of a viscous liquid inside the capscrew, similar to a shock absorber.

These and other aspects of the present invention will become apparent upon studying the following detailed description, figures and claims.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a given component by different names. This document does not intend to distinguish between components that differ in name but not function. In the following discussion and in the claims, the terms "including" and "comprising" are used in an open-ended fashion, and thus should be interpreted to mean "including, but not limited to . . ." Also, the term "couple" or "couples" is intended to mean either an indirect or direct electrical connection. Thus, if a first device "couples" to a second device, that connection may be through a direct electrical connection, or through an indirect electrical connection via other devices and connections. To the extent that any term is not specially defined in this specification, the intent is that the term is to be given its plain and ordinary meaning.

DETAILED DESCRIPTION OF THE PREFERRED EMBODIMENTS

Because of the desire to mount CPUs in area array interposer sockets, a device is needed to ensure that vibrational motion is kept to a minimum. The present invention provides a positive means for controlling vibration through an energy dissipation device, or damper. Additionally, this damper may be tuned to the specific system mass and stiffness.

The preferred embodiment of the invention is described below in the context of a processor chip and heat sink combination mounted on a circuit board with an interposer socket. It should be noted, however, that the chip need not be a processor nor is the heat sink required. Broadly, the invention is useful to reduce vibration for any type of component mounted to a circuit board.

Figure 1:
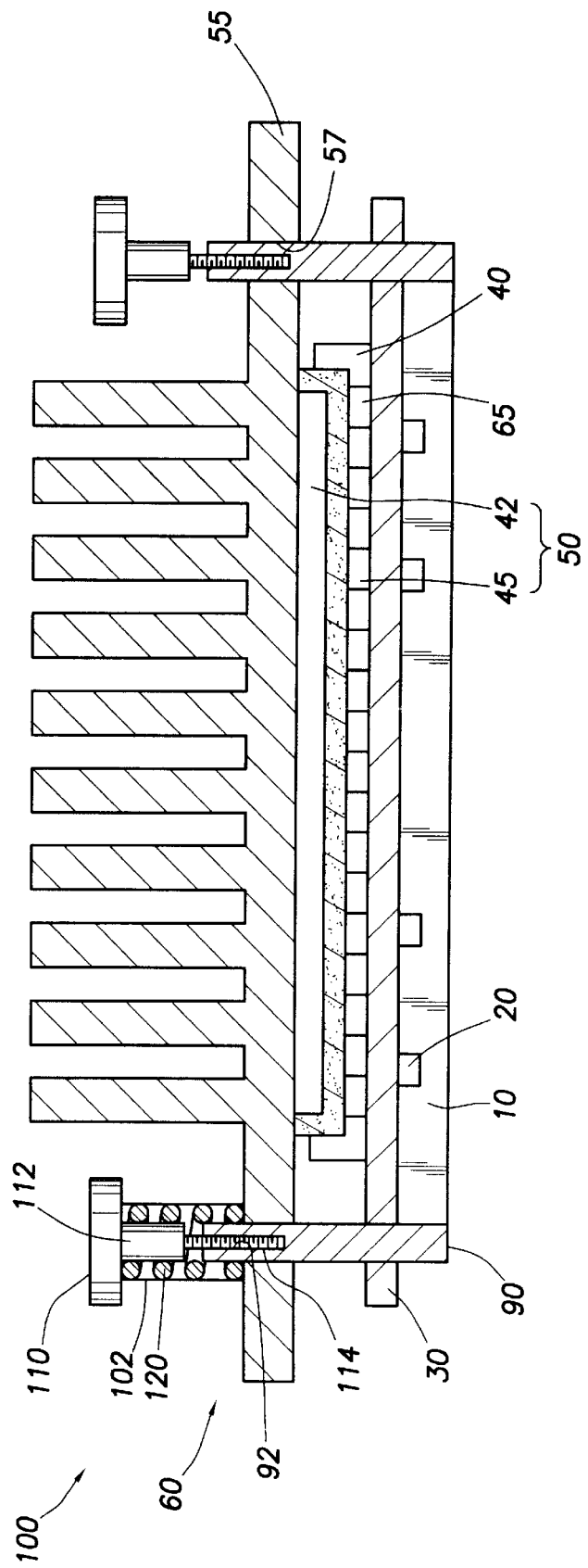
FIG. 1 is a schematic diagram of a system in accordance with a preferred embodiment of the present invention.

Referring initially to FIG. 1, system 100 includes a backing plate 10 with a plurality of recesses 20, a PWB 30, interposer socket 40, interposer columns 45, a landgrid array (LGA) or processor 42, a heat sink 55, and at least one tunable vibration damping assembly 60. When combined, interposer columns 45 and processor 42 are referred to as CPU assembly 50. Interposer socket 40 is mounted on PWB 30 and CPU assembly 50 is received in socket 40 in the conventional manner. As is known in the art, a plurality of interposer columns 45 connects PWB 30 to processor 42. Heat sink 55 is mounted on CPU assembly 50 in such a manner as to achieve sufficient thermal contact therewith. If desired, a material such as thermal grease (not shown) can be used at the interface to enhance the flow of heat from CPU assembly 50 into heat sink 55.

According to a preferred embodiment, heat sink 55 is held in place by at least one, and preferably a plurality of tunable vibration damping assemblies 60. Each tunable vibration damping assembly 60 preferably comprises a standoff 90, a helical coil spring 120, a damping sleeve 102, and a capscrew 110. Instead of a helical coil spring, any type of Belleville spring can be used. Each standoff 90 is mounted on or pressed into backing plate 10 and passes through a corresponding hole 57 in the base of heat sink 55. Standoffs 90 each preferably comprise a generally cylindrical member having a threaded internal bore 92. Each capscrew 110 includes a head 112 and a male threaded body 114 sized to threadingly engage bore 92.

Coil spring 120 preferably has an inside diameter that is larger than the outside diameter of standoff 90 and an outside diameter that is smaller than the diameter of head 112. Similarly, damping sleeve 102 preferably has an inside diameter that is larger than the outside diameter of coil spring 120 and an outside diameter that is smaller than the diameter of head 112. The damping sleeve may also be constructed in such a manner as to be integral with the coil spring.

Prior to the engagement of capscrew 110 with standoff 90, coil spring 120 and damping sleeve 102 are placed in concentric arrangement around standoff 90. Both coil spring 120 and damping sleeve 102 are preferably somewhat longer than the extension of standoff 90 above the base of heat sink 55 when they are in their natural, or non-compressed states. Thus, when it is desired to assemble one of the present tunable vibration damping assemblies 60, capscrew 110 is threaded into bore 92 of standoff 90 and tightened until head 112 engages and then compresses spring 120 and sleeve 102. Capscrew 110 is tightened until spring 120 and sleeve 102 are compressed a desired amount and thus apply a desired amount of force to heat sink 55. In this manner, a tunable damping force is applied to heat sink 55 to maintain it in good thermal contact with the CPU while simultaneously damping vibrations or shocks that would otherwise be transmitted from the PWB to the CPU.

Figure 2:
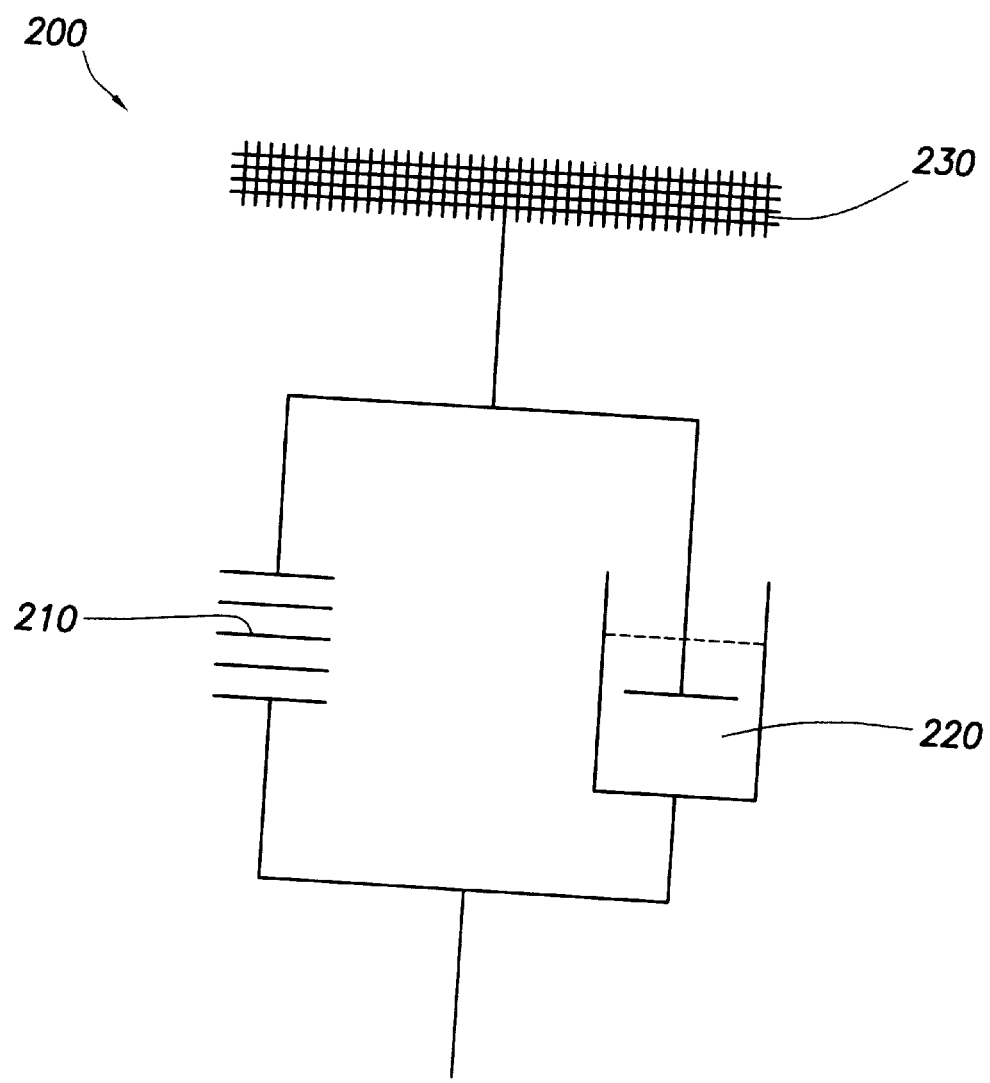
FIG. 2 is a schematic diagram of a spring-dashpot model.

In order to describe the operation of the present invention, reference will be briefly made to FIG. 2, a schematic of a simple spring-dashpot system. FIG. 2 includes a Kelvin element comprising a linear spring in parallel with a viscous damper. Kelvin model 200 includes a spring component 210, a dashpot component 220, and a fixed origin 230. In a Kelvin model, spring component 210 functions according to Hookean elastic behavior. For example, when a force is applied to spring 210 it deforms by an amount that is directly proportional to the applied force. The classical solid behavior is given by Equation 1.

$$F=kx \quad (1)$$

where F is force (stress), x is the extension distance (strain), and k is the proportionality constant. This constant is also called a modulus. The deformation is reversible when the stress is removed. However, if stress is continuously applied, a Hookean solid does not deform any further; it shows no time-dependant deformation.

Dashpot, or damper 220, functions according to Newtonian viscous behavior. For example, the applied force (stress) is proportional not to the distance (strain), but rather to the rate of strain. This classical liquid behavior is given by Equation 2.

$$F=kdx \quad (2)$$

where F is force, dx is the rate of extension (strain), and k is the proportionality constant. In shear this equation is written:

$$\tau=\eta\gamma \quad (3)$$

and the proportionality constant η is viscosity. The damping material continues to deform as long as force is applied. The deformation is not reversible; when the force is removed, the damping material ceases to deform.

It should be understood that the only material that exhibits true Newtonian viscous behavior is a viscous liquid. In reality, a "viscous" solid displays viscous and elastic behavior. However, for explanatory purposes only, in the current invention, coil spring 120 is assumed to display purely elastic behavior and damper 102 is assumed to display purely viscous behavior.

When these two components are combined, the viscoelastic behavior of the system can be modeled using the elastic and viscous elements in parallel; the strain of the two elements in parallel is the same and the total stress is the sum of the stress in the two elements. As the load is applied, the viscous element resists deformation but slowly deforms, transferring the applied stress to the elastic element. Thus, the deformation of this two-element model is limited by the extensibility of the elastic element. When load is removed, the "transient creep" strain is recovered.

More specifically, this model exhibits a "delayed elastic" or viscoelastic response to applied loads. After sudden imposition of a shear stress, spring 210 will eventually reach the expected strain, but is retarded in doing so by dashpot 220. Dashpot or damper 102 of the present invention, accordingly prevents spring 120 from reaching its expected strain, thus limiting vibrational motion.

In order to ensure that vibrational motion is minimized in the present application, damper 102 should possess the following properties. It should be resistant to temperatures below 130° C., possess a loss factor of at least 0.010, and be easily manufactured by companies such as Sorbothane. Examples of such materials include, but are not limited to, rubbers, silicones, and neoprenes.

The simple Kelvin model described above describes a simple spring-dashpot system which is useful to understanding the following model which more accurately models the behavior of vibration damping assembly 60.

The present spring-mass-dashpot system preferably includes four clamping springs with total spring constant K (lb/in), a CPU and heat sink with mass W/g (lb-sec$^2$/in), and four damping sleeves, each having a damping value C (lb-sec/in). The magnification factor of a single degree of freedom spring-mass-damper system can be determined according to Equation 4:

$$X/X_0 = 1/[\{1-(\omega\omega/\omega_n)^2\}^2 + \{2\xi(\omega/\omega_n)\}^2]^{1/2} \quad (4)$$

where:

X is the amplitude of vibration (in),
$X_0$ is static deflection, or $F_0/K$ (in),
$\omega$ is frequency of excitation (rad/sec),
$\omega_n$ is natural frequency, or $[Kg/W]^{1/2}$ (rad/sec),
$\xi$ is a damping factor, $C/C_0$,
$C_0$ is critical damping, $2W\omega_n/g$ (lb-sec/in),
k is the spring constant of one clamping spring (lb/in),
K is the total clamping spring constant, or nK (lb/in),
n is the number of clamping springs, in this case 4,
W is the weight of heat sink (lb),
g is a gravitational constant, or 386 in/sec$^2$, and
$F_0$ is the total static clamping force applied (lb).

For a resonant, lightly damped system $\xi=0.01$, and Equation 4 becomes $X/X_0=50$. However, for a resonant, critically damped system $\xi=1$, and Equation 4 becomes $X/X_0=0.5$. Thus, the vibration amplitude of the heat sink can be reduced by a factor of 100 or more.

The critical damping value of the four damping sleeves can be determined by Equation 5:

$$C_0 = 2W\omega_n = 2[KW/g]^{1/2} \quad (5)$$

Thus, Equation 5 defines the amount of damping necessary in the four damping sleeves to provide a critically damped system.

Critical damping refers to zero amplitude for a damped oscillator; the body returns back to its equilibrium position at an optimum rate. Critical damping is desirable because vibrational oscillations cease, preventing intermittent motion. By tuning the damping sleeves 102 to equal approximately twice the product of the mass weight and natural frequency, critical damping is obtained.

In order to tune a damper, a critical damping value is mathematically projected, similar to that shown in Equation 5. A material possessing a damping value equal to a fraction of the projected critical damping value is then employed as the damper. For example, according to Equation 5, if the weight of the heat sink is 0.10 lb and the natural frequency of the system is 500 rad/sec, then the critical damping value, $C_0$ is 100 lb-rad/sec, because $C_0=2W\omega_n$. If four damping sleeves are used, each sleeve should possess a damping factor C of approximately 25 lb-rad/sec.

The damper may be produced in the form of a sleeve (e.g., sleeve 102 in FIG. 1), a viscous liquid inside the capscrew, or any form capable of damping the clamping spring 120. Additionally, the damper may be part of a Kelvin system as described above (e.g., spring and dashpot in parallel) or as part of a Maxwell system (e.g., spring and dashpot in series) and the spring(s) and damper(s) need not necessarily be positioned adjacent to each other.

It should be understood that the damping assemblies and systems described herein may be used in a computer system including a chassis, a system board, and an input device. In a preferred embodiment, the input device is either a mouse or a keyboard.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A device for maintaining a heat sink in a desired relationship to a mounting base while limiting the transmission of shock and vibrational motion to and from the heat sink, comprising:
   a fastener extending from the mounting base;
   a spring compressed between said fastener and said heat sink; and
   a damper compressed between said fastener and said heat sink;
   said fastener maintaining said spring and said damper in a compressed state such that said spring and said damper bear on said heat sink.

2. The device of claim 1 wherein said fastener comprises a threaded fastener.

3. The device of claim 1 wherein said spring comprises a coil spring.

4. The device of claim 1 wherein said damper comprises an elastomeric sleeve.

5. The device of claim 1 wherein said damper comprises material which is resistant to temperatures below 130° C.

6. The device of claim 1 wherein said damper comprises damping material possessing a loss factor of at least 0.010.

7. The device of claim 1 wherein said damper comprises damping material manufactured by Sorbothane.

8. The device of claim 1 wherein the damper comprises a liquid.

9. The device of claim 1 wherein said damper comprises critically damped damping material.

10. A method for limiting shock/vibrational motion of a microprocessor comprising placing a damping material in parallel with a clamping spring, wherein the damping material and spring are compressed between a single fastener and a heat sink.

11. The method of claim 10 wherein the damping material is in the form of a sleeve that surrounds the clamping spring.

12. The method of claim 11 wherein the damping material is concentric with the clamping spring.

13. The method of claim 10 wherein the damping material is resistant to temperatures below 130° C.

14. The method of claim 10 wherein the damping material possesses a loss factor of at least 0.010.

15. The method of claim 10 wherein the damping material is manufactured by Sorbothane.

16. The method of claim 10 wherein the damping material comprises a liquid.

17. A method for limiting shock/vibrational motion of a microprocessor comprising placing a damping material in parallel with a clamping spring, wherein the damping material and spring are compressed between separate fasteners and a heat sink.

18. The method of claim 17 wherein the damping material is resistant to temperatures below 130° C.

19. The method of claim 17 wherein the damping material possesses a loss factor of at least 0.010.

20. The method of claim 17 wherein the damping material is manufactured by Sorbothane.

21. The method of claim 17 wherein the damping material comprises a liquid.

22. A method for limiting shock/vibrational motion of a microprocessor comprising placing a damping material in series with a clamping spring, wherein the damping material and spring are compressed between a single fastener and a heat sink.

23. The method of claim 22 wherein the damping material is in the form of an elastomeric solid.

24. The method of claim 22 wherein the damping material is resistant to temperatures below 130° C.

25. The method of claim 22 wherein the damping material possesses a loss factor of at least 0.010.

26. The method of claim 22 wherein the damping material is manufactured by Sorbothane.

27. The method of claim 22 wherein the damping material comprises a liquid.

28. A vibration isolation device for use in reducing the transmission of vibration to an electrical component mounted between a circuit board and a first component using one or more fasteners extending from said circuit board to said first component, comprising:
   a spring compressible between a fastener and said first component; and
   a damper compressible between a fastener and said first component.

29. The device of claim 28 wherein said first component is a heat sink.

30. The device of claim 28 wherein said damper comprises a sleeve that mounts around said fasteners.

31. The device of claim 30 wherein said spring fits between said fasteners and said sleeve.

32. The device of claim 28 wherein the electrical component is a processor.

33. A computer system comprising:

a chassis;

an input device; and a system board mounted inside said chassis, wherein said system board includes a component mounted thereto using a vibration isolator comprising:
   a fastener;
   a first component;
   a spring compressible between said fastener and said first component; and
   a damper compressible between said fastener and said first component.

34. The computer system of claim 33 wherein the input device is a mouse or a keyboard.

35. The computer system of claim 33 wherein said first component is a heat sink.

36. The computer system of claim 33 wherein said damper comprises a sleeve that mounts around said fasteners.

37. The computer system of claim 36 wherein said spring fits between said fasteners and said sleeve.

* * * * *